United States Patent [19]

Yasuda et al.

[11] Patent Number: 4,840,916

[45] Date of Patent: Jun. 20, 1989

[54] PROCESS FOR FABRICATING AN AVALANCHE PHOTODIODE

[75] Inventors: Kazuhito Yasuda, Tokyo; Yutaka Kishi, Yokohama, both of Japan

[73] Assignee: Fujitsu Limited, Kawasaki, Japan

[21] Appl. No.: 90,432

[22] Filed: Aug. 21, 1987

Related U.S. Application Data

[63] Continuation-in-part of Ser. No. 738,723, May 29, 1985, abandoned.

[30] Foreign Application Priority Data

May 31, 1984 [JP] Japan .................. 59-109434

[51] Int. Cl.$^4$ ........................... H01L 31/18
[52] U.S. Cl. ........................... 437/3; 437/5; 357/30
[58] Field of Search .............. 437/3, 5; 156/649; 357/30 A, 13

[56] References Cited

U.S. PATENT DOCUMENTS 4,442,444 4/1984 Osaka .................... 357/13
4,481,523 11/1984 Osaka et al. ............ 357/13

FOREIGN PATENT DOCUMENTS 0053513 6/1982 European Pat. Off. .
56-49581 5/1981 Japan .
56-71985 6/1981 Japan .
57-112084 7/1982 Japan .................... 357/30 A

OTHER PUBLICATIONS

*Japanese Journal of Applied Physics,* Supplements, vol. 22, No. 22-1, 1983, pp. 291-294, Tokyo, JP; K. Yasuda et al.
*Applied Physics Letters,* vol. 35, No. 6, Sep. 15, 1979, pp. 466-468.
*Applied Physics Letters,* vol. 45, No. 7, Oct. 1, 1984, pp. 759-761.

*Primary Examiner*—Aaron Weisstuch
*Attorney, Agent, or Firm*—Armstrong, Nikaido, Marmelstein, Kubovcik & Murray

[57] ABSTRACT

Disclosed is an avalanche photodiode wherein a light absorption layer and a multiplication layer are first grown on substrate. The multiplication layer is then mesa-etched and another semiconductor layer is second grown on the mesa-etched multiplication layer. A dopant having a conductivity opposite to that of the above layers is introduced from the top of the another semiconductor layer to form a doped region extending inside the mesa portion and p-n junction is therefore formed inside the mesa-etched portion. This causes the distribution of multiplication in the active area to become uniform, since the rough surface of the top of the mesa-etched portion exists outside the multiplication region.

6 Claims, 4 Drawing Sheets

Fig. I PRIOR ART
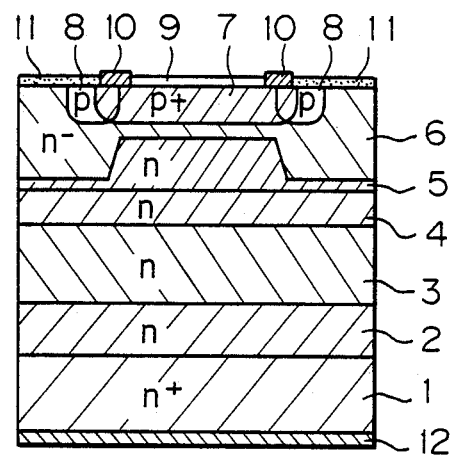
Fig. 2 PRIOR ART
MULTIPLICATION FACTOR
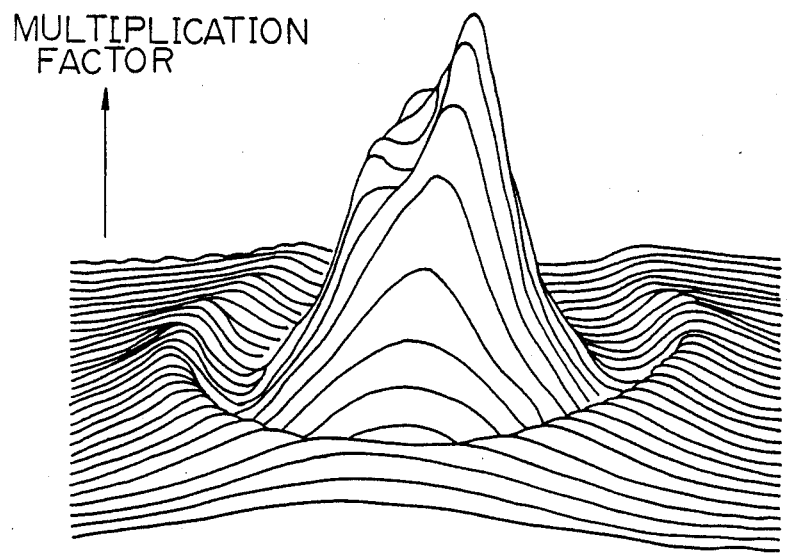

PROCESS FOR FABRICATING AN AVALANCHE PHOTODIODE

This application is a division of application Ser. No. 738,723 filed May 29, 1985, abandoned.

BACKGROUND OF THE INVENTION

1. Field of the Invention

The present invention relates to a process for fabricating an avalanche photodiode, more particularly, it relates to a process for fabricating an avalanche photodiode made of compound semiconductors for detecting long-wavelength light, and to an avalanche photodiode obtained by that fabrication process.

2. Description of the Related Art

Silicon (Si) photodiodes are known which reach near 100% quantum efficiency at wavelengths of 0.8 to 0.9 $\mu$m. However, the long-wavelength cutoff of silicon is 1.1 $\mu$m, which makes it impossible to use Si photodiodes for fiber-optic communication with long-wavelength light, such as 1.3 $\mu$m or 1.55 $\mu$m. At the wavelength of 1.55 $\mu$m, for example, optical fibers may have an extremely low transmission loss of, e.g., 0.2 dB/km, and in the 1.0 to 1.6 $\mu$m region, germanium (Ge) photodiodes, III-V ternary photodiodes, and III-V quaternary photodiodes have shown high quantum efficiencies.

In long distance fiber-optic communication, the use of long-wavelength light with low transmission loss necessitates that the signal-to-noise (S/N) ratios of the photodetectors be as high as possible, but Ge photodiodes have a relatively low S/N ratio due to equal hole to electron ionization coefficients and high dark currents. In this regard, compound semiconductor photodiodes such as III-V ternary or quaternary photodiodes may have the desired high ionization coefficients and desired low dark current, thus giving a high S/N ratio.

Avalanche photodiodes are operated at high reverse-bias voltages where avalanche multiplication takes place. A process for fabricating a typical avalanche photodiode made of a compound semiconductor, e.g., indium gallium arsenide (InGaAs), comprises the steps of: (i) continuously growing, on an $n^+$-type substrate of, e.g., indium phosphide (InP), an n-type light absorption layer of, e.g., InGaAs, and an n-type electric-field modifying or first multiplication layer of, e.g., InP, (ii) selectively etching the periphery of the first multiplication layer, leaving the first multiplication layer in the form of a mesa, (iii) melting back the exposed surface of the mesa-etched first multiplication layer, (iv) growing an $n^-$-type semiconductor layer of, e.g., InP, on the melted-back first multiplication layer, and (v) doping an impurity from the top surface of the $n^-$-type layer to form a $p^+$-type impurity doped light receiving region extending into the $n^-$-type semiconductor layer but not reaching the n-type first multiplication layer; the $p^+$-type doped region having a pattern that is larger than the top of the mesa portion. An $n^-$-type second multiplication layer is defined between the $p^+$-type doped region and the n-type first multiplication layer. A p-type guard ring region may be formed by selectively doping an impurity into the $n^-$-type layer along the periphery of the $p^+$-type doped region, the guard ring region existing in a portion external to the top surface of the mesa portion. A passivation layer, electrodes etc. are then formed.

The first multiplication layer is made into a mesa shape to increase the breakdown voltage at the periphery of the $p^+$-type doped region where light should not be received and to decrease the breakdown voltage in the central portion of the $p^+$-type doped region where light is to be received. The breakdown voltage of a p-n junction increases with the decrease in the dopant concentration of the n-type region if the p-type region has the same dopant concentration. Therefore, the deeper portion of the $n^-$-type semiconductor layer surrounding the mesa portion of the first multiplication layer enables an increase in the breakdown voltage of the p-n junction near the periphery of the $p^+$-type doped region where light should not be received. On the other hand, since the mesa-shaped n-type first multiplication layer exists near the central portion of the $p^+$-type impurity doped region, the breakdown voltage decreases in the central portion of the $p^+$-type impurity doped region where light is to be received.

To form the above-mentioned structure comprising the first multiplication layer in the form of a mesa, liquid phase crystal growths have been carried out twice, but discontinuously. Namely, the first crystal growth is stopped after the n-type semiconductor layer is grown and selective etching is then effected to form the mesa shaped first multiplication layer, followed by the second crystal growth for forming the $n^-$-type semiconductor layer. Melting back the exposed surface of the etched or mesa shaped first multiplication layer in a thickness of 0.5 $\mu$m or more is carried out just before the second crystal growth procedure, to remove defects induced at the surface of the etched first multiplication layer and to ensure the continuity of the grown crystals in spite of the discontinuity of the crystal growth procedures.

Avalanche photodiodes fabricated in accordance with the above process, however, have a nonuniform distribution of avalanche multiplication in the active area or the light receiving area, thus decreasing the S/N ratio of the avalanche photodiodes.

SUMMARY OF THE INVENTION

In view of the above, an object of the invention is to provide an avalanche photodiode particularly useful for long wavelength fiber-optic communication.

Another object of the invention is to provide an avalanche photodiode in which the above-mentioned problems of the prior art are eliminated.

A further object of the invention is to provide an avalanche photodiode having a uniform distribution of avalanche multiplication in the active or light receiving area, thus increasing the S/N ratio.

The above and other objects, features and advantages of the invention are attained by a process for fabricating an avalanche photodiode, comprising the steps of: carrying out a first crystal growth for forming a first semiconductor layer on a semiconductor body comprising a light absorption layer; selectively etching a periphery of the first semiconductor layer to obtain a first semiconductor layer in the form of a mesa; carrying out a second crystal growth for forming a second semiconductor layer on the mesa-shaped first semiconductor layer after etching; and, forming a first impurity doped region extending from the top surface of the second semiconductor layer to the inside of the first semiconductor layer, whereby a p-n junction is defined in the inside of the first semiconductor layer and the remaining portion of the first semiconductor layer where the first impurity doped region is not formed defines a multiplication layer.

The present inventors found that avalanche photodiodes fabricated in accordance with the process previously mentioned prior art have nonuniform distribution of the multiplication in the active area of the avalanche photodiodes. The present inventors also found that the above-mentioned nonuniform distribution of the multiplication in the active area is derived from the nonuniformity of the interface between the two semiconductor layers, one semiconductor layer being the mesa-etched semiconductor layer (first semiconductor layer) and the other semiconductor layer being the semiconductor layer grown on the mesa-etched semiconductor layer (second semiconductor layer). Although melting back of the surface of the mesa-etched semiconductor layer is carried out just before carrying out the second liquid phase growth, some defects or nonuniformity remain on the surface of the melted-back mesa-etched semiconductor layer. Further, melting-back tends to preferentially remove the periphery of the mesa portion with the result that the top surface of the mesa portion becomes rounded-off These defects or nonuniformity and roundness of the surface of the mesa-etched semiconductor layer cause the nonuniformity of the multiplication distribution in the active area of the avalanche photodiode.

The present invention eliminates the above mentioned problem, i.e., the nonuniform distribution of the multiplication in the active area of an avalanche photodiode, by shifting the location of the undesired interface between the two separately grown layers into the $p^+$-type impurity doped region, that is, outside the multiplication region, i.e., the first and second multiplication layers mentioned before. This measure enables the multiplication in the active area to be made uniform because multiplication then occurs only in the multiplication region where the nonuniform interface between the two separately grown layers is not present.

The invention is particularly directed to an avalanche photodiode for long wavelength fiber-optic communication. To have a sufficient light absorption coefficient at a long wavelength, the material of the light absorption layer must have a relatively narrow bandgap energy. For example, a bandgap energy of 1.24 to 0.775 eV is needed for a wavelength of 1.0 to 1.6 μm. Examples of materials having a bandgap energy of 1.35 to 0.75 eV include $In_xGa_{1-x}As$ (x=0.53), and $In_xGa_{1-x}As_yP_{1-y}$ ($0.53 \leq x \leq 1$, $0 \leq y < 1$).

The present invention also relates to an avalanche photodiode fabricated by the above-described process.

BRIEF DESCRIPTION OF THE DRAWING

The present invention and relevant prior art are further illustrated below with reference to the drawings in which:

FIG. 1 is a sectional view of an avalanche photodiode in the prior art;

FIG. 2 is a diagram showing the distribution of avalanche multiplication in an avalanche photodiode in the prior art;

DESCRIPTION OF THE PREFERRED EMBODIMENTS

Figure 3:
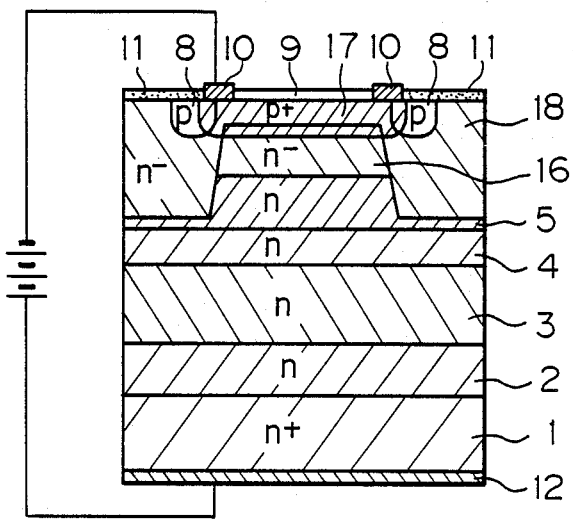
FIG. 3 is a sectional view of an avalanche photodiode fabricated according to the present invention.

Before describing the present invention, an example of an avalanche photodiode in the prior art is illustrated with reference to FIGS. 1 and 2. In FIG. 1, reference numeral 1 denotes an $n^+$-type substrate of InP, 2 an n-type buffer layer of InP, 3 an n-type light absorption layer of $In_{0.53}In_{0.47}As$, 4 an n-type transition layer of $In_{0.67}Ga_{0.33}As_{0.70}P_{0.30}$, 5 an n-type first multiplication layer of InP, 6 an n-type second multiplication layer of InP, 7 a $p^+$-type impurity doped region, 8 a p-type guard ring region, 9 a nonreflecting coating layer, 10 a p-side electrode of Au·Zn, 11 a surface passivation layer, and 12 an n-side electrode of Au·Ge.

In this avalanche photodiode, the buffer layer 2, the light absorption layer 3, the transition layer 4, and the n-type first multiplication layer 5 are continuously grown on the substrate 1. The periphery of the n-type semiconductor layer 5 is then selectively etched to leave the layer 5 in the form of a mesa, as shown in FIG. 1. After melting back the surface of the mesa-shaped layer 5, the $n^-$-type semiconductor layer 6 is grown on the mesa-shaped layer 5. The top surface of the resultant layer 6 then becomes substantially flat. Cadmium ions are then diffused into the $n^-$-type 6 to form a $p^+$-type doped region 7 that stops before reaching the n-type first multiplication layer 5, leaving an $n^-$-type second multiplication layer 6 between the $p^+$-type doped region 7 and the n-type first multiplication layer 5. Multiplication takes place predominantly in the $n^-$-type second multiplication layer 6. In the avalanche photodiode shown in FIG. 1, a nonuniform interface resultant from the two separate crystal growths, i.e., the interface between the n-type first multiplication layer 5 and the $n^-$-type second multiplication layer 6, exists in the multiplication region, i.e., below the bottom of the $p^+$-type doped region 7. As a result, nonuniform multiplication occurs.

FIG. 2 shows the distribution of multiplication in the active area of an avalanche photodiode shown in FIG. 1. This was determined by scanning the active area with a very fine light beam and detecting the corresponding output of the avalanche photodiode. The peaks of the diagram in FIG. 2 represent the levels of the output or multiplication, and thus show the nonuniformity of the multiplication in the active area of the avalanche photodiode of the prior art.

FIG. 3 illustrates an avalanche photodiode according to the present invention. In FIG. 3, parts similar to those in FIG. 1 are denoted by the same reference numerals. In this avalanche photodiode, mesa-etching is carried out after an $n^-$-type second multiplication layer 16 of InP is continuously grown on the n-type first multiplication layer 5 in the first crystal growth. The second crystal growth is then carried out to form another $n^-$-type semiconductor layer 18 of InP on the $n^-$-type second multiplication layer 16. A $p^+$-type doped region 17 extends from the top surface of the $n^-$-type layer 18 to the inside of the mesa-etched $n^-$-type layer 16. Therefore, the interface between the first grown layer 16 and the second grown layer 18 exists within the $p^+$-type doped region 17, which does not constitute the multiplication region. That is, that interface is not inside the multiplication region. This allows the elimination of nonuniform multiplication in the active area of the avalanche photodiode. The fabrication of an avalanche photodiode shown in FIG. 3 is described below with reference to FIGS. 4 to 6.

Figure 4:
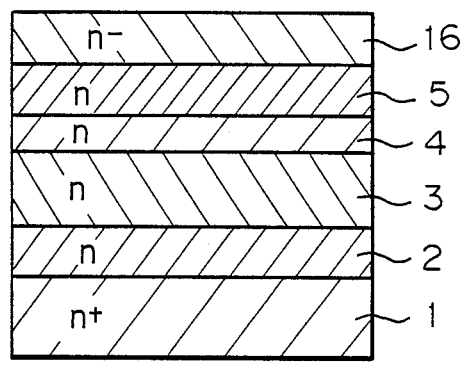
FIGS. 4 to 6 are sectional views of an avalanche photodiode in the steps of a process for fabricating an avalanche photodiode according to the present invention.

Referring to FIG. 4, on an n+-type substrate 1 of, e.g., InP, layers 2 to 5 and 16 are continuously grown by a conventional liquid phase crystal growth procedure. The n+-type substrate 1 has a dopant concentration of, e.g., approximately $10^{17}$ cm$^{-3}$. Layer 2 is an n-type buffer layer for ensuring the good quality of the crystal of the layer 3 and has a thickness of, e.g., 2 to 4 $\mu$m, and a dopant concentration of approximately $10^{16}$ cm$^{-3}$. Layer 3 is an n-type light absorption layer of, e.g., $In_{0.53}Ga_{0.47}As$, and has a thickness of 1.0 to 3.5 $\mu$m and a dopant concentration of $10^{14}$ to $2\times10^{16}$ cm$^{-3}$. Layer 4 is a transition layer of, e.g., $In_{0.67}Ga_{0.33}As_{0.70}P_{0.30}$, and has a thickness of 0.1 to 1 $\mu$m and a dopant concentration of $10^{14}$ to $2\times10^{16}$ cm$^{-3}$. The transition layer 4 has a bandgap energy, e.g., 0.9 eV, intermediate between those of the light absorption layer 3, e.g., 0.75 eV. and the layers 5 and 16, e.g., 1.35 eV. Layer 5 is an n-type first multiplication layer of, e.g., InP, for modifying the electric field in the layers 3, 4, and layer 16 and has a thickness of 0.6 to 2 $\mu$m and a dopant concentration of $10^{16}$ to $3.5\times10^{16}$ cm$^{-3}$. Layer 16 is an n−-type semiconductor layer of, e.g., InP. When the layer 16 is grown in the first liquid phase crystal growth, it has a thickness of 1.0 to 2 $\mu$m and a dopant concentration of $5\times10^{14}$ to $10^{16}$ cm$^{-3}$. The formation of the n−-type semiconductor layer 16 in the first liquid phase crystal growth has not been attempted heretofore in the processes of the prior art.

Figure 5:
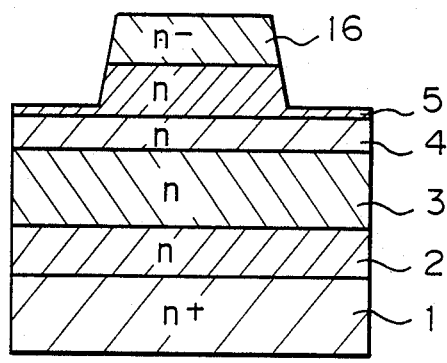

Referring to FIG. 5, the periphery of layer 16 and a part of Layer 5 is selectively etched to leave the layer 16 and part of the layer 5 in the form of a mesa. The mesa portion has a diameter of, for example, 80 $\mu$m. The mesa-etching may be effected by, for example, forming a silicon nitride ($Si_3N_4$) film (not shown) on the n−-type layer 16 by plasma CVD, patterning the $Si_3N_4$ film in a circle having a diameter of, e.g., 80 $\mu$m, and wet etching the n−-type layer 16 and a part of the n-type layer 5 using the $Si_3N_4$ film as a mask. After etching is completed, the $Si_3N_4$ film is then removed.

Figure 6:
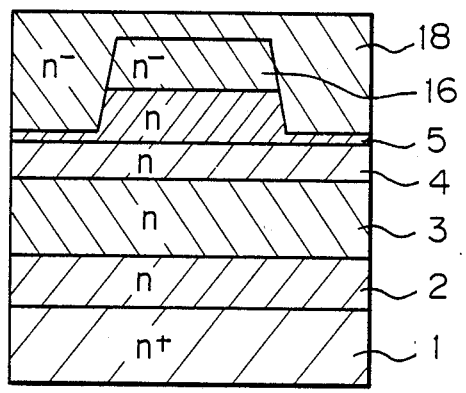

Referring to FIG. 6, the second liquid phase crystal growth is carried out to form another n−-type semiconductor layer 18 on the mesa-etched layers 16 and 5. To remove defects and contamination on the exposed surface of the mesa-etched layers 16 and 5, the exposed surfaces of the mesa-etched layers 16 and 5 are melted back in a thickness of 0.5 $\mu$m or more by a hot melting solution just before the second liquid phase crystal growth. Preferably, the n−-type semiconductor layer 18 is of the same material and has the same dopant as those of the layer 16. Furthermore, the dopant concentration of the layer 18 is preferably equal to or less than that of the layer 16. In this case, the layer 18 of InP has a dopant concentration of $5\times10^{14}$ to $10^{16}$ cm$^{-3}$, which is usually attained by a compensation of acceptor in the liquid phase crystal growth, and has a thickness of 0.5 to 2.5 $\mu$m on the mesa portion. The layer 18 may have a substantially flat top surface in spite of the mesa shape of the layers 16 and 5 which are the base of the growth of the layer 18.

Referring again to FIG. 3, a p-type impurity, e.g., cadmium, is selectively doped from the top surface of the n−-type layer 18 to form a p+-type light receiving region 17. The p+-type light receiving region 17 has a diameter of, e.g., 120 $\mu$m, to cover the mesa portion and a depth of 1.5 to 3.0 $\mu$m to reach inside the n−-type second multiplication layer 16. The bottom of the p+-type doped light receiving region 17 must reach inside the n−-type semiconductor layer 16, so that the top surface of the mesa portion exists inside the p+-type doped region 17, but should not reach the n-type first multiplication layer 5, so as to remain a part of the n-type semiconductor layer 16 without being doped with the p-type dopant. The remaining n−-type semiconductor layer 16 defines a second multiplication region where the multiplication predominantly takes place.

A p-type guard ring region 8 is preferably but not necessarily formed by selectively doping a p-type impurity, e.g., beryllium, along the periphery of the p+-type doped region 17 in the n−-type semiconductor layer 18. A passivation layer 11 of, e.g., $Si_3N_4$, a nonreflecting layer 9 of, e.g., $Si_3N_4$, a p-side electrode 10 of, e.g., Au/Zn, an n-side electrode 12 of, e.g., Au/Ge, etc. are then formed. The p-side electrode 10 has an inner diameter of, e.g., approximately 100 $\mu$m, and an active area where light is to be received is defined inside that p-side electrode 10.

The operation of the avalanche photodiode in FIG. 3 is as described below. A reverse bias of, e.g., 100 V, is applied between the p-side and n-side electrodes 10 and 12. Light enters through the nonreflecting coating layer 9, the active area, and reaches the light absorption layer 3 where long wavelength incident light is absorbed, due to a narrow bandgap energy of the material of the light absorption layer 3, and electron-hole pairs are generated. The thus-generated holes are attracted toward the reverse biased p+-type doped region 17 and avalanche multiplication (or impact ionization) takes place predominantly in the n−-type second multiplication layer 16. This avalanche multiplication results in a current gain.

Figure 7:
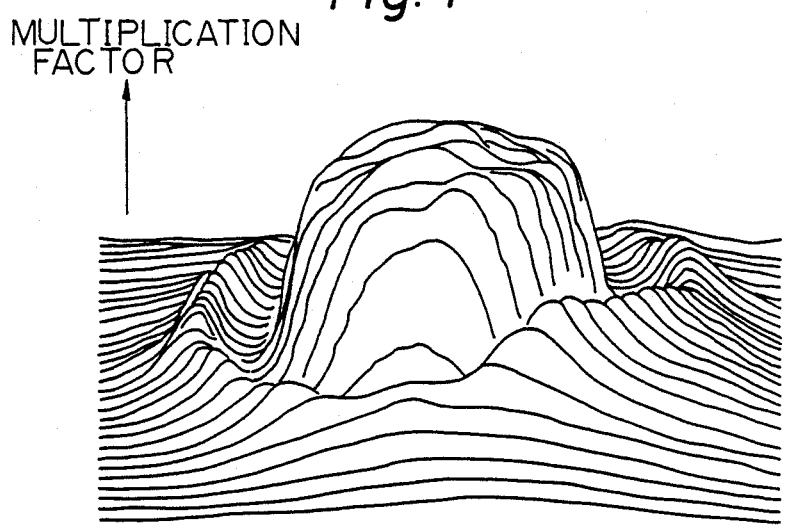
FIG. 7 is a diagram showing the distribution of avalanche multiplication in an avalanche photodiode fabricated according to the present invention.

The melted-back surface of the mesa portion exists inside the p+-type doped region 17 where the electric field is not present and the multiplication does not take place. Therefore, even if that melted-back surface of the mesa portion is rough, the multiplication cannot be affected by the roughness of the melted-back surface of the mesa portion. Thus, the avalanche photodiode in FIG. 3 gives a uniform distribution of multiplication in the active area, as shown in FIG. 7. FIG. 7 is a diagram obtained by scanning a very fine light beam of 1.30 $\mu$m in wavelength in the active area of an avalanche photodiode fabricated according to a process described with reference to FIGS. 3 to 6 and illustrating the outputs in relation to the position of scanning.

FIG. 7 clearly demonstrates the uniform distribution of the multiplication in the entire active area when compared with FIG. 2.

The presence of the n−-type second multiplication layer 16 is preferable because noise in the multiplication can be reduced when the multiplication takes place in a low electric-field, due to a certain relationship of the ionization coefficients of the electron and hole. The electric field in a layer can be lowered by reducing the dopant concentration of the layer and adding another layer having a high dopant concentration. Thus, the combination of the n−-type second multiplication layer 16 and the n-type first multiplication layer 5 preferably reduces the noise.

The n-type first multiplication layer 5 also lowers the electric fields in the light absorption layer 3 and the transition layer 4, which enables the prevention of dark currents therein. If the electric fields in the light absorption layer 3 and the transition layer 4 are high, the dark currents are easily increased by a tunneling phenomenon because the bandgap energies of the layers 3 and 4 are low.

The $n^-$-type second multiplication layer 16 should have a sufficient thickness to ensure a sufficient multiplication because the amount of multiplication or avalanching decreases where the electric field is lowered.

The transition layer 4 grades the bandgap energies between the light absorption layer 3 which has a low bandgap energy and the multiplication layers 5 and 16 which have high bandgap energies, so that carriers, i.e., holes, generated in the light absorption layer 3 can be easily transported to the multiplication layers 5 and 16.

Figure 8:
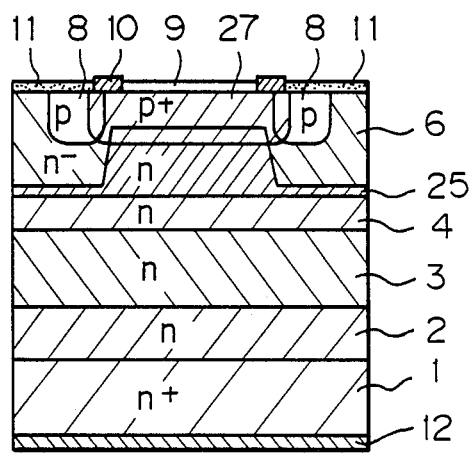
FIG. 8 is a sectional view of another embodiment of the present invention.

FIG. 8 illustrates another embodiment of an avalanche photodiode according to the present invention. This avalanche photodiode is similar to those in FIGS. 1 and 3 and the similar parts are denoted by the same reference numerals as used in FIGS. 1 and 3. In this avalanche photodiode, a $p^+$-type impurity doped light receiving region 27 also extends inside a semiconductor layer 25 that has been selectively etched in the form of a mesa. Therefore, the melted-back surface of the mesa portion exists inside the $p^+$-type doped region 27 and cannot affect the multiplication that takes place in the remaining n-type semiconductor layer 25 outside the $p^+$-type doped, region 27, allowing uniform distribution of multiplication in an active area. However, the n-type semiconductor layer 25, the multiplication layer, does not comprise two types of layers having high and low dopant concentrations as in FIG. 3.

It is obvious that many changes or modifications may be made without departing from the spirit of the invention. For example, the conductivity types of the layers in FIGS. 3 and 8 can be reversed and the materials of the light absorption layer and other layers may be changed.

We claim:

1. A process for fabricating an avalanche photodiode, comprising the steps of:

carrying out a first crystal growth for forming a first semiconductor layer of a first conductivity type on a semiconductor body comprising a light absorption layer;

selectively etching a periphery of said first semiconductor layer to leave the first semiconductor layer in the form of a mesa;

melting-back the exposed surface of the first semiconductor layer in the form of a mesa;

carrying out a second crystal growth for forming a second semiconductor layer on said mesa-etched and melted-back first semiconductor layer; and forming an impurity doped region of a second conductivity type extending from the top surface of said second semiconductor layer into the inside of said first semiconductor layer, whereby a p-n junction is defined in said inside of said first semiconductor layer and the remaining portion of said first semiconductor layer where said impurity doped region is not formed defines a multiplication layer.

2. A process according to claim 1, wherein said first semiconductor layer comprises upper and lower semiconductor layers, said upper semiconductor layer having a lower dopant concentration than that of said lower semiconductor layer, and said p-n junction is formed in said upper semiconductor layer.

3. A process according to claim 1, wherein said light absorption layer is of InGaAs.

4. A process according to claim 1, wherein said first semiconductor layer is of InP, InGaAs or InGaAsP.

5. A process according to claim 1, wherein a transition layer is formed between said light absorption layer and said first semiconductor layer, said transition layer having an intermediate energy bandgap between those of said light absorption layer and said first semiconductor layer.

6. A process according to claim 1, further comprising the step of forming a guard ring region by selectively doping an impurity along the periphery of said impurity doped region in said second semiconductor layer.

* * * * *